(12) United States Patent
Smith et al.

(10) Patent No.: US 6,171,645 B1
(45) Date of Patent: *__Jan. 9, 2001

(54) POLYOL-BASED METHOD FOR FORMING THIN FILM AEROGELS ON SEMICONDUCTOR SUBSTRATES

(75) Inventors: Douglas M. Smith; William C. Ackerman, both of Albuquerque, NM (US); Richard A. Stoltz, Plano, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/115,854

(22) Filed: Jul. 15, 1998

Related U.S. Application Data

(63) Continuation of application No. 08/748,926, filed on Nov. 14, 1996, now Pat. No. 5,807,607.
(60) Provisional application No. 60/006,852, filed on Nov. 16, 1995, provisional application No. 60/006,853, filed on Nov. 16, 1995, provisional application No. 60/012,764, filed on Mar. 4, 1996, provisional application No. 60/012,800, filed on Mar. 4, 1996, and provisional application No. 60/014,005, filed on Mar. 25, 1996.

(51) Int. Cl.[7] .............................. B05D 3/02; B05D 5/12; H01L 21/00
(52) U.S. Cl. ........................ 427/96; 427/344; 427/378; 427/380; 427/397.7; 427/384; 438/758
(58) Field of Search ................................ 427/387, 58, 96, 427/377, 378, 379, 380, 384, 397.7, 337, 343, 344; 437/195, 978; 438/758

(56) References Cited

U.S. PATENT DOCUMENTS

| 4,230,803 | 10/1980 | Weidenbach et al. ............... 435/176 |
| 4,713,233 | 12/1987 | Marsh et al. ........................ 423/608 |

(List continued on next page.)

FOREIGN PATENT DOCUMENTS

| 382310 | 8/1990 | (EP) . |
| 454239 | 10/1991 | (EP) . |
| WO 92/03378 | 3/1992 | (WO) . |

OTHER PUBLICATIONS

Einarsrud et al, Chem. Process. Adv. Mater., pp 355–61, 1992.*

(List continued on next page.)

Primary Examiner—Erma Cameron
(74) Attorney, Agent, or Firm—David Denker; Wade James Brady, III; Frederick J. Telecky, Jr.

(57) ABSTRACT

This invention has enabled a new, simple nanoporous dielectric fabrication method. In general, this invention uses a polyol, such as glycerol, as a solvent. This new method allows both bulk and thin film aerogels to be made without supercritical drying, freeze drying, or a surface modification step before drying. Prior art aerogels have required at least one of these steps to prevent substantial pore collapse during drying. Thus, this invention allows production of nanoporous dielectrics at room temperature and atmospheric pressure, without a separate surface modification step. Although not required to prevent substantial densification, this new method does not exclude the use of supercritical drying or surface modification steps prior to drying. In general, this new method is compatible with most prior art aerogel techniques. Although this new method allows fabrication of aerogels without substantial pore collapse during drying, there may be some permanent shrinkage during aging and/or drying.

17 Claims, 7 Drawing Sheets

U.S. PATENT DOCUMENTS

| | | | |
|---|---|---|---|
| 4,851,150 | 7/1989 | Hench et al. | 252/315.6 |
| 4,954,327 | 9/1990 | Blount | 423/338 |
| 5,076,980 | 12/1991 | Nogues et al. | 264/65 |
| 5,097,317 | 3/1992 | Fujimoto et al. | 357/72 |
| 5,207,814 | 5/1993 | Cogliati et al. | 65/18.3 |
| 5,242,647 | 9/1993 | Poco | 264/225 |
| 5,275,796 | 1/1994 | Tillotson et al. | 423/338 |
| 5,294,480 | 3/1994 | Mielke et al. | 428/240 |
| 5,368,887 | 11/1994 | Hoshino et al. | 427/226 |
| 5,391,364 | 2/1995 | Cogliati | 423/335 |
| 5,409,683 * | 4/1995 | Tillotson et al. | 423/338 |
| 5,470,802 | 11/1995 | Gnade et al. | 437/238 |
| 5,472,913 | 12/1995 | Havemann et al. | 437/195 |
| 5,488,015 | 1/1996 | Havemann et al. | 437/195 |
| 5,494,858 | 2/1996 | Gnade et al. | 437/231 |
| 5,496,527 | 3/1996 | Yokogawa et al. | 423/338 |
| 5,504,042 | 4/1996 | Cho et al. | 437/247 |
| 5,523,615 | 6/1996 | Cho et al. | 257/632 |
| 5,525,857 | 6/1996 | Gnade et al. | 313/309 |
| 5,536,965 | 7/1996 | Beratan et al. | 257/444 |
| 5,548,159 | 8/1996 | Jeng | 257/634 |
| 5,561,318 | 10/1996 | Gnade et al. | 257/638 |
| 5,661,344 * | 8/1997 | Havemann et al. | 257/758 |
| 5,736,425 * | 4/1998 | Smith et al. | 438/778 |

OTHER PUBLICATIONS

Haereid, Norges Tekniske Hogskole, vol. 69, pp 7–218, Jan. 1993.*

Siv Hæreid, *Preparation and Characterization of Transparent Monolithic Silica Xerogels with Low Density,* Jan. 1993, Norges Tekniske Hogskole Universiteteti I Trondheim.

V.S. Klimenko, L.A. Kulik, and V.V. Vashchinskaya, Dependence of the Composition and Structure of Silicic Acid Xerogels on the Nature of the Solvent, 1986, Ukrainskii Khimicheskii Zhurnal, vol. 52, No. 12, pp. 1247–1251.

D. Basmadjian, G. N. Fulford, B.I. Parsons, and D.S. Montgomery, The Control of the Pore, Volume and Pore Size Distribution in Alumina and Silica Gels by the Addition of Water Soluble Organic Polymers Dec. 1962, Journal of Catalysis, vol. 1, No. 6, pp. 547–563.

H. Yokogawa, M. Yokoyama, Hydrophobic Silica Aerogels, Journal of Non–Crystalline Solids 186 (1995) 23–29.

* cited by examiner

POLYOL-BASED METHOD FOR FORMING THIN FILM AEROGELS ON SEMICONDUCTOR SUBSTRATES

This application claims benefit of provisional application Ser. No. 60/006,852 filed Nov. 16, 1995, provisional Ser. No. 60/006,853 filed Nov. 16, 1995, provisional Ser. No. 60/012,764 filed Mar. 4, 1996, provisional Ser. No. 60/012,800 filed Mar. 4, 1996, provisional Ser. No. 60/014,005 filed Mar. 25, 1996, and a continuation of Ser. No. 08/748,926 filed Nov. 14, 1996 now U.S. Pat. No. 5,807,607.

FIELD OF THE INVENTION

This invention pertains generally to precursors and deposition methods for thin films aerogels on semiconductor substrates, including deposition methods suited to aerogel thin film fabrication of nanoporous dielectrics.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits which can accomplish more in less time in a smaller package while consuming less power. However, many of these desires are in opposition to each other. For instance, simply shrinking the feature size on a given circuit from 0.5 microns to 0.25 microns can increase power consumption by 30%. Likewise, doubling operational speed generally doubles power consumption. Miniaturization also generally results in increased capacitive coupling, or crosstalk, between conductors which carry signals across the chip. This effect both limits achievable speed and degrades the noise margin used to insure proper device operation.

One way to diminish power consumption and crosstalk effects is to decrease the dielectric constant of the insulator, or dielectric, which separates conductors. Probably the most common semiconductor dielectric is silicon dioxide, which has a dielectric constant of about 3.9. In contrast, air (including partial vacuum) has a dielectric constant of just over 1.0. Consequently, many capacitance-reducing schemes have been devised to at least partially replace solid dielectrics with air.

U.S. Pat. No. 4,987,101, issued to Kaanta et al., on Jan. 22, 1991, describes a method for fabricating gas (air) dielectrics, which comprises depositing a temporary layer of removable material between supports (such as conductors), covering this with a capping insulator layer, opening access holes in the cap, extracting the removable material through these access holes, then closing the access holes.

U.S. Pat. No. 5,103,288, issued to Sakamoto, on Apr. 7, 1992, describes a multilayered wiring structure which decreases capacitance by employing a porous dielectric. This structure is typically formed by depositing a mixture of an acidic oxide and a basic oxide to form a non-porous solid, heat treating to precipitate the basic oxide, and then dissolving out the basic oxide to form a porous solid. Dissolving all of the basic oxide out of such a structure may be problematic, because small pockets of the basic oxide may not be reached by the leaching agent. Furthermore, several of the elements described for use in this non-gel-based method (including sodium and lithium) are generally considered contaminants in the semiconductor industry, and as such are usually avoided in a production environment. Creating only extremely small pores (less than 10 nm) may be difficult using this method, yet this requirement will exist as submicron processes continue to scale towards a tenth of a micron and less.

Another method of forming porous dielectric films on semiconductor substrates (the term "substrate" is used loosely herein to include any layers formed prior to the conductor/insulator level of interest) is described in U.S. Pat. No. 4,652,467, issued to Brinker et al., on Mar. 24, 1987. This patent teaches a sol-gel technique for depositing porous films with controlled porosity and pore size (diameter), wherein a solution is deposited on a substrate, gelled, and then cross-linked and densified by removing the solvent through evaporation, thereby leaving a dry, porous dielectric. This method has as a primary objective the densification of the film, which teaches away from low dielectric constant applications. Dielectrics formed by this method are typically 15% to 50% porous, with a permanent film thickness reduction of at least 20% during drying. The higher porosities (e.g. 40%–50%) can only be achieved at pore sizes which are generally too large for such microcircuit applications. These materials are usually referred to as xerogels, although the final structure is not a gel, but an open-pored (the pores are generally interconnected, rather than being isolated cells) porous structure of a solid material.

As shown in the Brinker patent, semiconductor fabricators have used sol-gel techniques to produce dense thin films in semiconductors. The word sol-gel, however, does not describe a product but a reaction mechanism whereby a sol transforms into a gel. A sol is a colloidal suspension of solid particles in a liquid. One method of forming a sol is through hydrolysis and condensation reactions. These reactions cause a multifunctional monomer in a solution to polymerize into relatively large, highly branched particles. Many monomers suitable for polymerization are metal alkoxides. For example, a tetraethylorthosilicate (TEOS) monomer may be partially hydrolyzed in water by the reaction Reaction conditions may be controlled such that, on the average, each monomer undergoes a desired number of hydrolysis reactions to partially or fully hydrolyze the monomer. TEOS which has been fully hydrolyzed becomes $Si(OH)_4$. Once a molecule has been at least partially hydrolyzed, two molecules can then link together in a condensation reaction, such as or to form an oligomer and liberate a molecule of water or ethanol. The Si—O—Si configuration in the oligomer formed by these reactions has three sites available at each end for further hydrolysis and condensation. Thus, additional monomers or oligomers can be added to this molecule in a somewhat random fashion to create a highly branched polymeric molecule from literally thousands of monomers.

One theory is, that through continued reactions, one or more molecules in the sol may eventually reach macroscopic dimensions so that it/they form a network which extends substantially throughout the sol. At this point (called the gel point), the substance is said to be a gel. By this definition, a gel is a substance that contains a continuous solid skeleton enclosing a continuous liquid phase. As the skeleton is porous, a gel can also be described as an open-pored solid structure enclosing a pore fluid. An oligomerized metal alkoxide, as defined herein, comprises molecules formed from at least two alkoxide monomers, but does not comprise a gel.

In a typical thin film xerogel process, an ungelled precursor sol may be applied to (e.g., spray coated, dip-coated, or spin-coated) a substrate to form a thin film on the order of several microns or less in thickness, gelled, and dried to form a dense film. The precursor sol often comprises a stock solution, a solvent, and a gelation catalyst. This catalyst typically modifies the pH of the precursor sol in order to speed gelation. In practice, such a thin film is subjected to rapid evaporation of volatile components. Thus, the deposition, gelation, and drying phases may take place simultaneously (at least to some degree) as the film collapses rapidly to a dense film. Drying by evaporation of the pore fluid produces extreme capillary pressure in the microscopic pores of the wet gel. This pressure typically causes many pores to collapse and reduces the gel volume as it dries, typically by an order of magnitude or more.

A dried gel that is formed by collapsing and densifying a wet gel during drying has been termed a xerogel. Typical thin film xerogel methods produce gels having limited porosity (Up to 60% with large pore sizes, but generally substantially less than 50% with pore sizes of interest). An aerogel is distinguishable from a xerogel primarily by largely avoiding pore collapse during drying of the wet gel.

U.S. Pat. No. 5,470,802, *A Low Dielectric Constant Material For Electronics Applications,* issued on Nov. 28, 1995 to Gnade, Cho and Smith describes a method for forming highly porous, finely pored (pore diameter of less than 80 nm and preferably of 2 nm to 25 nm), low dielectric constant (k less than 3.0 and preferably less than 2.0) dielectric films for use as semiconductor insulators. The U.S. '802 invention uses a surface modification agent to control densification and other shrinkage effects during drying, resulting in a substantially undensified, highly porous rigid structure which can be processed at atmospheric pressure. U.S. '802 teaches that the porous structure can be made hydrophobic (water repelling) and that the pores formed in the dielectric can be made small enough to allow this method to be used with device feature sizes in the 0.5 to 0.1 micron range, or even smaller. This results in a thin film that can be fabricated with almost any desired porosity (thin films with greater than 90% porosity have been demonstrated). Such films have been found to be desirable for a low dielectric constant insulation layer in microelectronic applications.

These techniques relate to fabricating dielectric (electrically nonconductive) materials, usually inorganic dielectrics. The inorganic porous dielectrics "aerogels" are nanoporous having average pore sizes less than 250 nanometers (preferably less than 50 nanometers and more preferably less than 10 nanometers and still more preferably less than 5 nanometers). Nanoporous dielectrics are of particular interest in advanced semiconductor manufacturing. The nanoporous inorganic dielectrics include the nanoporous metal oxides, particularly nanoporous silica.

Gnade et al.'s teachings include a subcritical drying method. That is, they dry the gelled film at one or more sub-critical pressures (from vacuum to near-critical) and preferably, at atmospheric pressure. Traditional aerogel processes typically replace the pore fluid with a drying fluid such as ethanol or $CO_2$. The traditional processes then remove the drying fluid from a wet gel (dry) under supercritical pressure and temperature conditions. By removing the fluid in the supercritical region, vaporization of liquid does not take place. Instead, the fluid undergoes a constant change in density during the operation, changing from a compressed liquid to a superheated vapor with no distinguishable state boundary. This technique avoids the capillary pressure problem entirely, since no state change boundaries ever exist in the pores.

SUMMARY OF THE INVENTION

Copending U.S. patent application Ser. No. 08/746,679, titled *Aerogel Thin Film Formation From Multi-Solvent Systems,* by Smith et al. teaches a method of varying the precursor sol viscosity independently of the dried gel density. This multi-solvent method comprises the step of depositing a thin film of an aerogel precursor sol on a semiconductor substrate; the sol comprises a reactant, which may be a partially polymerized metal alkoxide or other precursor, dispersed in a first solvent and a second solvent. The method further comprises preferentially evaporating substantially all of the second solvent from the thin film, preferably without substantial evaporation of the first solvent, and subsequently allowing the thin film to cross-link, thus forming a wet gel having pores arranged in an open-pored structure on the semiconductor substrate. This multi-solvent method allows the precursor sol viscosity to be varied independently of the dried gel density. However, it still generally requires some method, such as atmospheric control, to limit evaporation of the first solvent.

Figure 1:
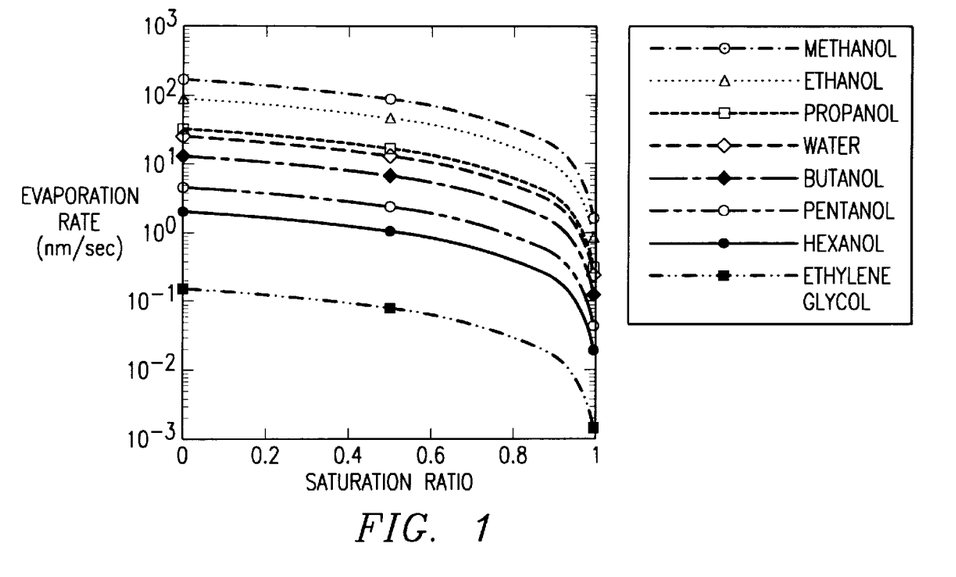
FIG. 1 contains a graph of the variation of evaporation rate with saturation ratio and solvent type.

In principle, this evaporation rate control can be accomplished by controlling the solvent vapor concentration above the wafer. However, our experience has shown that the solvent evaporation rate is very sensitive to small changes in the vapor concentration and temperature. In an effort to better understand this process, we have modeled isothermal solvent vaporization from a wafer as a function of percent saturation. This modeling is based on basic mass transfer theory. *Transport Phenomena,* (particularly Chapters 16 and 17) by R. B. Bird, W. E. Stewart, and E. N. Lightfoot, is a good reference for mass transfer theory. These calculations were performed for a range of solvents. The ambient temperature evaporation rates for some of these solvents are given in FIG. 1. For evaporation to not be a processing problem, the product of the evaporation rate and processing time (preferably on the order of minutes) must be significantly less than the film thickness. This suggests that for solvents such as ethanol, the atmosphere above the wafer would have to be maintained at over about 99% saturation. However, there can be problems associated with allowing the atmosphere to reach saturation or supersaturation. Some of these problems are related to condensation of an atmospheric constituent upon the thin film. Condensation on either the gelled or ungelled thin film has been found to cause defects in an insufficiently aged film. Thus, it is generally desirable to control the atmosphere such that no constituent is saturated.

Rather than using a high volatility solvent and precisely controlling the solvent atmosphere, it has been discovered that a better solution is to use a low volatility solvent with less atmospheric control. To simplify atmospheric control, it may be desirable to have at least a three degrees C. (or more preferably, 10 degrees C.) difference between the condensation temperature of the solvent vapor and the substrate. Viscosity during deposition can be controlled either by heating/cooling the precursor sol or by combining this new approach with the multi-solvent approach described above. Although it is preferable to analyze a solvent to determine its expected evaporation rate, a preliminary preference on the selection of the low volatility solvent can be made. Prefer- ably the low volatility solvent is one with a boiling point in the 175–300° C. range and (for TEOS based gels) that it be miscible with both water and ethanol. Thus, some suitable low volatility solvent candidates are polyols, these preferred polyols include trihydric alcohols, such as glycerol and glycols (dihydric alcohols), such as ethylene glycol, 1,4-butylene glycol, and 1,5-pentanediol. Of these, the most economical are ethylene glycol and glycerol.

Figure 5:
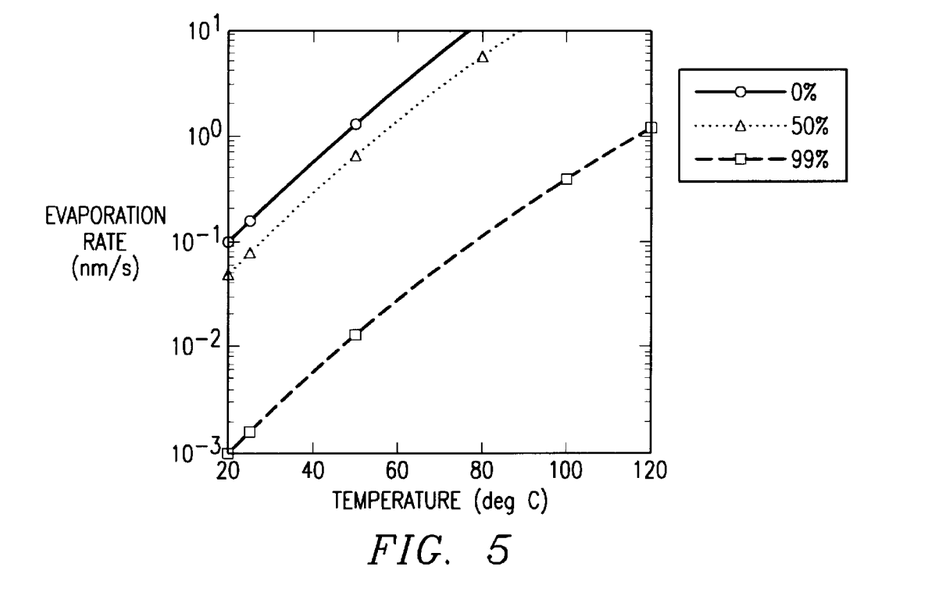
FIG. 5 contains a graph of the evaporation rate for ethylene glycol as a function of temperature and atmospheric saturation ratio.
Figure 11:
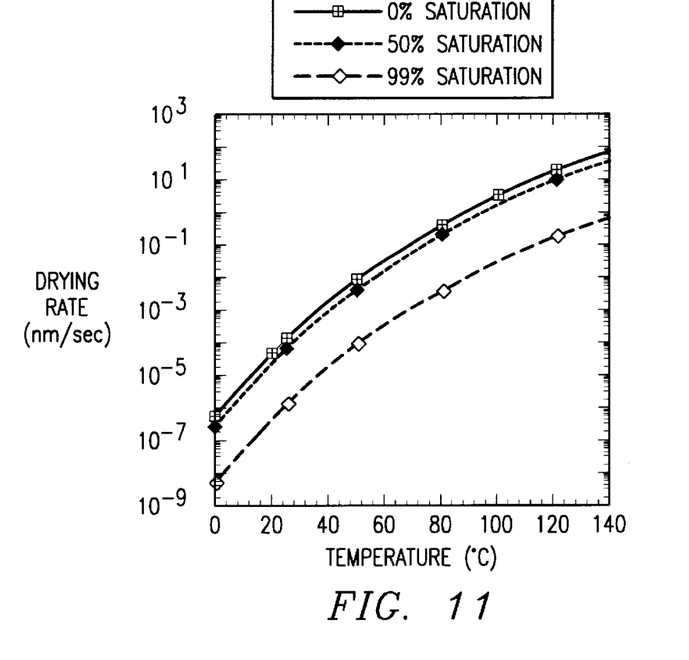
FIG. 11 contains a graph of the evaporation rate for glycerol a function of temperature and atmospheric saturation ratio.

The use of a polyol allows a loosening (as compared to prior art solvents) of the required atmospheric control during deposition and/or gelation. This is because, that even though saturation should still preferably be avoided, the atmospheric solvent concentration can be lowered without excessive evaporation. FIG. 5 shows how the evaporation rate of ethylene glycol varies with temperature and atmospheric solvent concentration. FIG. 11 shows how the evaporation rate of glycerol varies with temperature and atmospheric solvent concentration. It has been our experience that, with polyols, acceptable gels can be formed by depositing and gelling in an uncontrolled or a substantially uncontrolled atmosphere. In this most preferred approach (a substantially uncontrolled atmosphere) atmospheric controls, if any, during deposition and gelation are typically limited to standard cleanroom temperature and humidity controls, although the wafer and/or precursor sol may have independent temperature controls.

One attractive feature of using a polyol as a solvent is that at ambient temperature, the evaporation rate is sufficiently low so that several minutes at ambient conditions will not yield dramatic shrinkage for thin films. However, in addition to serving as a low vapor pressure and water-miscible solvent, polyols may also participate in sol-gel reactions. Although the exact reactions in this process have not been fully studied, some reactions can be predicted. If tetraethoxysilane (TEOS) is employed as a precursor with an ethylene glycol solvent, the ethylene glycol can exchange with the ethoxy groups:

Similarly, if tetraethoxysilane (TEOS) is employed as a precursor with a glycerol solvent, the glycerol can exchange with the ethoxy groups:

In principle, the presence and concentration of these chemical groups can change the precursor reactivity (i.e., gel time), modify the gel microstructure (surface area, pore size distribution, etc.), change the aging characteristics, or change nearly any other characteristic of the gel.

Ethylene glycol and glycerol could react with TEOS and produce a dried gel with surprisingly different properties than that of an ethanol/TEOS gel. Unanticipated property changes in the ethylene glycol/TEOS based gels and the glycerol/TEOS based gels generally include (at least on most formulations):

Lower density is achievable without supercritical drying or pre-drying surface modification
   Shorter gel times at a given catalyst content
   Strengths of bulk samples which are approximately an order of magnitude greater (at a given density) than conventional TEOS gels
   Very high surface area (~1,000 m$^2$/g)
   High optical clarity of bulk samples (This is likely due to a narrower pore size distribution than conventional TEOS gels)

Figure 6:
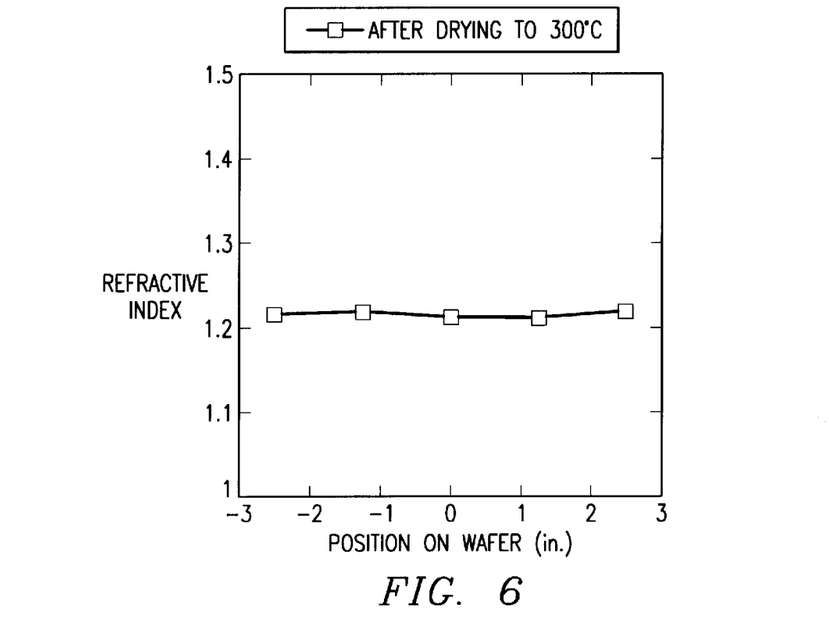
FIG. 6 contains a graph of the variation in refractive index during processing for a film produced using a 60/40 ethylene glyco/ethanol solution with a substantially uncontrolled atmosphere.
Figure 7:
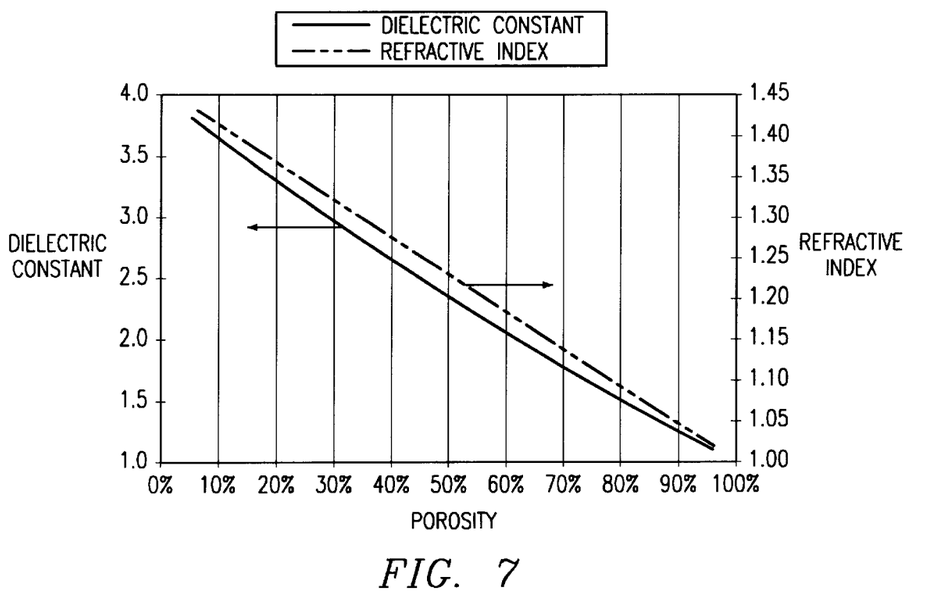
FIG. 7 contains a graph of the theoretical relationship between porosity, refractive index, and dielectric constant for nanoporous silica dielectrics.

Low density—With this invention, it is possible to form dried gels at very low densities without pre-drying surface modification or supercritical drying. These low densities can generally be down around 0.3 to 0.2 g/cm$^3$ (non-porous $SiO_2$ has a density of 2.2 g/cm$^3$), or with care, around 0.1 g/cm$^3$. Stated in terms of porosity (porosity is the percentage of a structure which is hollow), this denotes porosities of about 86% and 91% (about 95% porosity with a density of 0.1 g/cm$^3$). As shown in FIG. 7, these porosities correspond to dielectric constants of about 1.4 for the 86% porous, and 1.2 for 91% porous. The actual mechanism that allows these high porosities is not fully known. However, it may be because the gels have high mechanical strength, because the gels do not have as many surface OH (hydroxyl) groups, a combination of these, or some other factors. This method also obtains excellent uniformity across the wafer. FIG. 6 shows the refractive index (and thus the porosity) at several locations on a sample semiconductor substrate.

If desired, this process can be adjusted (by varying the TEOS/solvent ratios) to give any porosity from above 90% down to about 20, or even 10%. Typical prior art dried gels with small pore sizes required either supercritical drying or a surface modification step before drying to achieve these low densities. While some prior art xerogels have porosities greater than 50%; these prior art xerogels had substantially larger pore sizes (typically above 100 nm). These large pore size gels have less mechanical strength. Additionally, their large size makes them unsuitable for filling small (typically less than 1 $\mu$m) patterned gaps on a microcircuit.

Thus, this invention has enabled a new, simple nanoporous low density dielectric fabrication method. This new polyol-based method allows both bulk and thin film aerogels to be made without supercritical drying, or a surface modification step before drying. Prior art aerogels have required at least one of these steps to prevent substantial pore collapse during drying.

Density Prediction—By varying the ratio of ethylene glycol (EG) to ethanol (EtOH) in the precursor (at a fixed silica content), the density after ethanol/water evaporation can be calculated. This is likely due to the well controlled evaporation allowed by the low volatility solvent. To the extent that further shrinkage is prevented during aging and drying, this allows prediction of the density (and thus porosity) of the dried gel. Although this density prediction had generally not been a large problem with bulk gels, thin film gels had typically needed excellent atmospheric controls to enable consistent density predictions. Table 1 shows the predicted and actual density for three different EG/EtOH ratios after substantial ethanol and water removal, but before drying (EG removal).

TABLE 1

Correlation between predicted and measured density of wet bulk gels after ethanol/water evaporation.

| Stock Solution | Predicted Density (g/cm$^3$) | Density (g/cm$^3$) after 80° C. |
|---|---|---|
| 40% EtOH/60% EG | 0.37 | 0.40 |
| 51% EtOH/49% EG | 0.43 | 0.45 |
| 60% EtOH/40% EG | 0.53 | 0.50 |

To some degree, the glycerol-based processes behave similarly to the ethylene glycol-based processes. However, the ethylene glycol-based gels often have significant evaporation during aging. The glycerol-based gels have dramatically lower evaporation and shrinkage rates during aging. This allows atmospheric control to be loosened during aging. We have fabricated acceptable glycerol-based gels with no atmospheric controls during aging.

Figure 2:
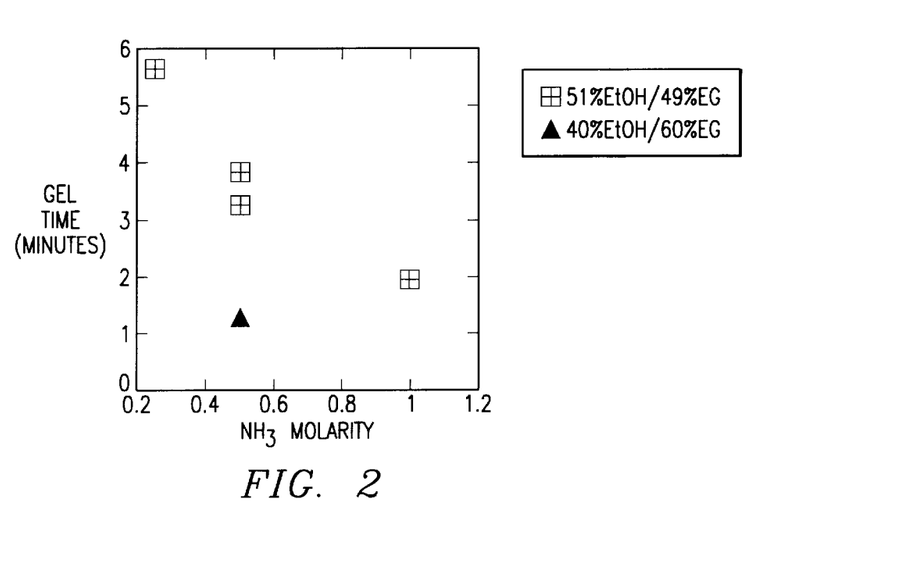
FIG. 2 contains a graph of the change in gel times (without solvent evaporation) for bulk ethylene glycol-based gels as a function of base catalyst FIG. 3 contains a graph showing the shrinkage of a thin film when dried in a 1 mm thick container.

Shorter Gel Times—In addition to enabling prediction of the density, the use of polyols may also change other properties of the sol-gel process. FIG. 2 shows gel times for two different ethylene glycol-based compositions as a function of the amount of ammonia catalyst used. These gel times are for bulk gels for which there is no evaporation of ethanol and/or water as there would be for thin films. Evaporation increases the silica content and thus, decreases the gel time. Therefore, these gels times may be the upper limit for a given precursor/catalyst. The gel times reported in FIG. 2 are approximately an order of magnitude shorter than precursors without a polyol. Gel times are generally also a first order dependence on the concentration of ammonia catalyst. This implies that it may be possible to easily control the gel times. For thin films of these new polyol-based gels, it is routine to obtain gelation within minutes, even without a gelation catalyst.

Higher Strength—The properties of the polyol-based samples appear to be quite different from regular gels as evidenced by both their low degree of drying shrinkage and differences in qualitative handling of the wet and dry gels. Thus, upon physical inspection, both the glycerol-based and ethylene glycol-based dried gels seem to have improved mechanical properties as compared to conventional dried gels. We have compared the bulk modulus measured during isostatic compaction measurements of one sample prepared using one ethylene glycol-based and one conventional ethanol-based dried bulk gel (both have the same initial density). After initial changes attributed to buckling of the structure, both samples exhibit power law dependence of modulus with density. This power law dependence is usually observed in dried gels. However, what is surprising is the strength of the ethylene glycol-based dried gel. At a given density (and thus, dielectric constant), the modulus of this sample of the ethylene glycol dried gel is an order of magnitude higher than the conventional dried gel. The glycerol-based gels also seem to have a high strength; generally, the strength is at least as good as the ethylene glycol-based gels. The reasons for this strength increase are unclear but may be related to the very high surface area of these dried gels (>1,000 m²/g) and the seemingly narrow pore size distribution.

High surface area—We measured the surface areas of some dried bulk gels. These surface areas were on the order of 1,000 m²/g, as compared to our typical dried gels which have surface area in the 600–800 m²/g range. These higher surface areas may imply smaller pore size and improved mechanical properties. It is unclear at this time why these higher surface areas are obtained with the polyol-based -based dried gels.

Pore size distribution—The optical clarity of these dried bulk gels was greater than any dried gels at this density that we have previously made. It is possible that this excellent optical clarity is due to a very narrow pore size distribution. However, it is unclear why the polyols have this affect. It is still not clear whether the apparently narrow pore size distribution is a result of a different microstructure at the gelation stage or differences in aging. Preliminary measurements on a bulk gel sample (with a density of about 0.22 g/cm³) showed that the mean pore diameter was 16.8 nm.

As shown above, some properties of the polyol-based gels apply to both bulk gels and thin films. However, some advantages are most evident when applied to thin films, such as nanoporous dielectric films on semiconductor wafers. One important advantage is that this new method allows high quality nanoporous films to be processed with no atmospheric controls during deposition or gelation.

Although it is important to be able to deposit and gel thin nanoporous films without atmospheric controls, it is also desirable to age thin nanoporous films without atmospheric controls. It has been discovered that this presents a bigger challenge than deposition. The primary reason is that while deposition and room temperature gelation can take place in minutes, or even seconds; room temperature aging typically requires hours. Thus, an evaporation rate that provides acceptable shrinkage for a short process, may cause unacceptable shrinkage when the process times are lengthened by an order of magnitude.

As an example, we have found that with some polyol-based gels, such as the ethylene glycol- and glycerol-based gels, a satisfactory aging time at room temperature is on the order of a day. However, Table 2 shows that, by using higher temperatures, we can age with times on the order of minutes. Thus, when these times and temperatures are combined with the evaporation rates of FIG. 1, FIG. 5, and FIG. 11, they give the approximate thickness loss during aging as shown in Table 3. These estimated thickness losses need to be compared with acceptable thickness losses. While no firm guidelines for acceptable thickness loss exist, one proposed guideline, for some microcircuit applications such as nanoporous dielectrics, is that the thickness losses should be less than 2% of the film thickness. For a hypothetical nominal film thickness of 1 μm (Actual film thicknesses may typically vary from significantly less than 0.5 μm to several μm thick), this gives an allowable thickness loss of 20 nm. As shown in Table 3, the glycerol-based gels (and other polyol-based gels with low vapor pressures) can achieve this preliminary goal without atmospheric control at room temperature. Thus, this invention allows thin film aerogels to be deposited, gelled, aged, and dried without atmospheric controls.

TABLE 2

Approximate Aging Time as a Function of Temperature For Some Polyol-Based Gels

| Aging Temperature (Degrees C.) | Aging Time For Polyol-Based Gels (Order of Magnitude Approximations) |
| --- | --- |
| 25 | 1 day |
| 100 | 5 minutes |
| 140 | 1 minute |

TABLE 3

Approximate Thickness Loss During Aging vs. Saturation Ratio.

| Aging Time/ Temperature | Thickness Loss During Aging | | | | | | | | |
| --- | --- | --- | --- | --- | --- | --- | --- | --- | --- |
| | Ethanol-Based Gel % Saturation | | | EG-Based Gel % Saturation | | | Glycerol-Based Gel % Saturation | | |
| | 0% | 50% | 99% | 0% | 50% | 99% | 0% | 50% | 99% |
| 1 day/ 25° C. | 8 mm | 7 mm | 86 μm | 17 μm | 7 μm | 172 nm | 13 nm | 5 nm | .1 nm |
| 300 sec/ 100° C. | — | — | — | 3 μm | 1.2 μm | 90 nm | 600 nm | 420 nm | 9 nm |
| 60 sec/ 140° C. | — | — | — | — | — | — | 6 μm | 3 μm | 60 nm |

Figure 3:
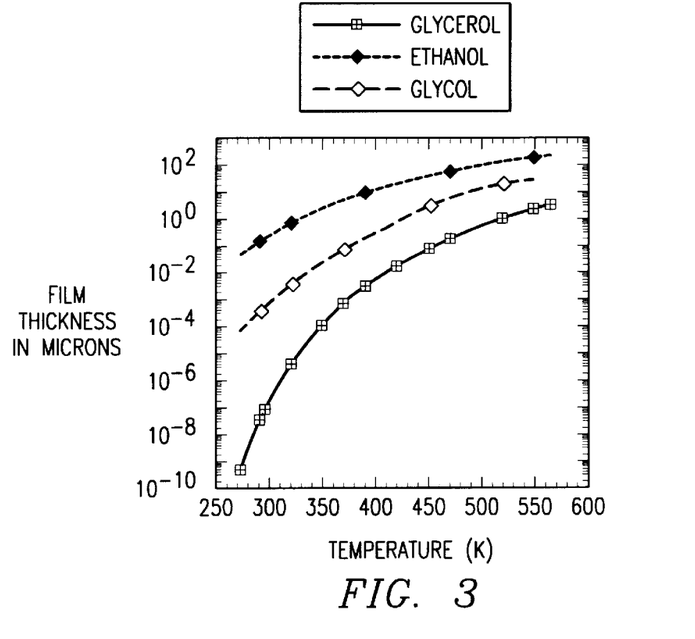
Figure 12:
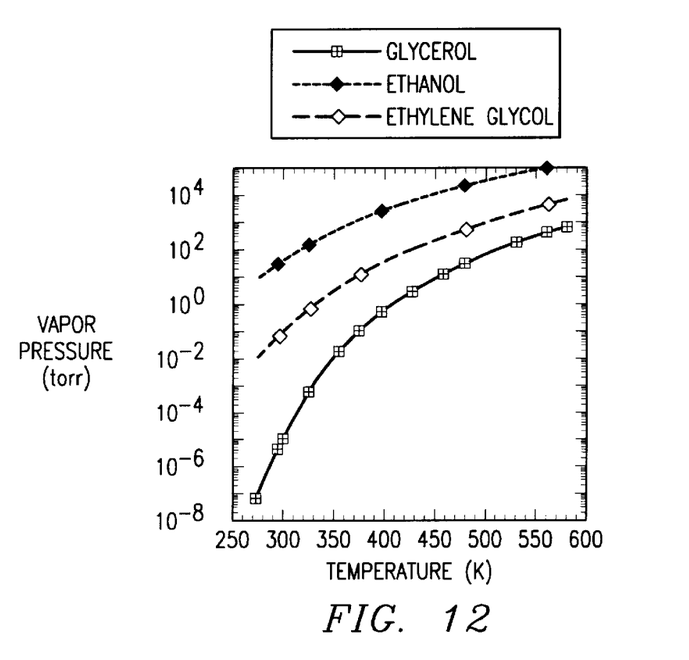
FIG. 12 contains a graph showing the change in vapor pressure with temperature.
Figure 13:
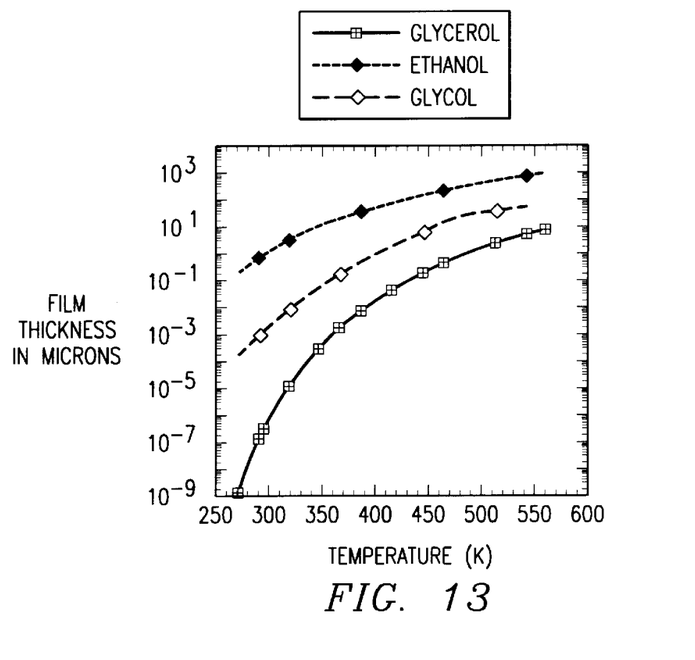
FIG. 13 contains a graph showing the shrinkage of a thin film when dried in a 5 mm thick container.

By using passive atmospheric control, this invention can be extended to have even lower evaporation losses. This passive control involves placing the gel in a relatively small closed container, at least during aging. In this aspect of the invention, evaporation from the wafer acts to raise the saturation ratio of the atmosphere inside the closed container. At any given temperature, this evaporation continues until the partial pressure of the vapor increases enough to equal the vapor pressure of the liquid. Thus, solvent/temperature combinations with lower vapor pressure will not allow as much liquid solvent to evaporate as a higher vapor pressure combination allows. FIG. 12 shows how vapor pressure varies with temperature for several solvents. If the container size is known, the amount of evaporation can be calculated. FIG. 13 shows an estimate of how thick of layer of solvent could potentially be evaporated if a 70% porous gel is placed in a 5 mm high cylindrical container that is the same diameter as the wafer. FIG. 3 shows a similar estimate for a container with a 1 mm high airspace above the wafer. These figures show that, with a 5 mm high airspace, the 20 nm preliminary goal is feasible up to 50 degrees C. for ethylene glycol-based gels and up to 120 degrees C. for glycerol-based gels. With the 1 mm airspace, the 20 nm goal is feasible up to 80 degrees C. for the ethylene glycol-based gels and 150 degrees C. for the glycerol-based gels. Of course, lower temperature processing allows less evaporation. Passive evaporation control using the 1 mm containers allows less than 1 nm of thickness loss for both ethylene glycol-based and glycerol-based gels at 20 degrees C.

There are many variations on this passive control approach. One variation allows the container size to increase. The thickness loss will linearly increase with the container volume. However, even a 1000 cubic centimeter container typically allows only 20 nm of ethylene glycol evaporation at 20 degrees C. Another variation is the gel porosity. Higher porosity gels generally experience greater thickness losses while lower porosity gels generally experience slightly smaller thickness losses. Other polyols may be used. However, different polyols may have different vapor pressure characteristics; thus, they may have different thickness losses.

One disadvantage of polyols, especially trihydric alcohols and other higher viscosity polyols, are their relatively high viscosities which could cause problems with gap-filling and/or planarization. As described in copending U.S. patent application Ser. No. 08/746,679, titled *Aerogel Thin Film Formation From Multi-Solvent Systems,* by Smith et al., a low viscosity, high volatility solvent can be used to lower the viscosity. We have compared the calculated viscosity of some ethylene glycol/alcohol and glycerol/alcohol mixtures at room temperature. This comparison shows; small quantities of alcohol significantly reduces the viscosity of these mixtures. Also, if the viscosity using ethanol in the stock solution is higher than desired, further improvement can be realized by employing methanol and tetramethoxysilane in the precursor solution. The viscosities in our comparison were for pure fluid mixtures only. In fact, depending upon the film precursor solution, the precursor solution might contain glycerol, alcohol, water, acid and partially reacted metal alkoxides. After refluxing, but before catalysis, the measured viscosity as a function of ethylene glycol content is shown in Table 4. As predicted, the use of methanol significantly lowers the viscosity. Of course, the viscosity can be increased before deposition by catalyzing the condensation reaction and hence, the values reported in Table 4 represent lower bounds.

TABLE 4

Measured Viscosity and Density of Glycol-Based Stock Solutions Before Activation.

| Stock Solution "Solvent" | Viscosity @ 25° C. (cp) | Viscosity @ 40° C. (cp) |
|---|---|---|
| 100% EtOH | 1.5 | — |
| 40% Ethylene glycol/60% EtOH | 3.1 | — |
| 49% Ethylene glycol/51% EtOH | 4.0 | — |
| 60% Ethylene glycol/40% EtOH | 5.4 | — |
| 40% Ethylene glycol/60% Methanol | 1.6 | — |
| 100% Ethylene glycol | 11.0 | 7.8 |
| 40% Glycerol/60% EtOH | 5.8 | — |
| 50% Glycerol/50% EtOH | 9.0 | — |
| 60% Glycerol/40% EtOH | 15.5 | — |
| 100% Glycerol | 1000. | 7.8 |

This multi-solvent approach may be combined with or replaced by an alternative approach. This alternate approach use elevated temperatures to reduce the sol viscosity during application. For example, the measured viscosity of the TEOS/ethylene glycol/water/nitric acid precursor described in the second preferred embodiment is 11 centipoise (cp) at 25 degrees C., but only 7.8 cp at 40 degrees C. Thus by heating and/or diluting the precursor during deposition, (such as by heating the transfer line and deposition nozzle of a wafer spin station) the viscosity of the precursor sol can be lowered to nearly any given viscosity. Not only does this preheat lower the sol viscosity, it may also speed gel times and accelerate the evaporation of any high volatility solvents. It may also be desirable to preheat the wafer. This wafer preheat should improve process control and may improve gap fill, particularly for the more viscous precursors. However, for many applications, wafer preheat is not required, thus simplifying process flows. When using a spin-on application method with this no wafer preheat approach, the spin station would not require a temperature controlled spinner.

Dried gels produced with this simple thin film aerogel fabrication process can be used in many applications. Some of these uses may not have been cost effective using prior art methods. These uses include low dielectric constant thin films (particularly on semiconductor substrates), miniaturized chemical sensors, thermal isolation structures, and thermal isolation layers (including thermal isolation structures for infrared detectors). As a general rule, many low dielectric constant thin films prefer porosities greater than 60%, with critical applications preferring porosities greater than 80 or 90%, thus giving a substantial reduction in dielectric constant. However, structural strength and integrity considerations may limit the practical porosity to no more than 90%. Some applications, including thermal isolation structures and thermal isolation layers, may need to sacrifice some porosity for higher strength and stiffness. These higher stiffness requirements may require dielectrics with porosities as low as 30 or 45%. In other high strength/toughness applications, especially sensors, where surface area may be more important than density, it may be preferable to use a low porosity gel with a porosity between 15% and 40%.

A method for forming a thin film nanoporous dielectric on a semiconductor substrate is disclosed herein. This method comprises the steps of providing a semiconductor substrate and depositing an aerogel precursor sol upon the substrate. This aerogel precursor sol comprises a metal-based aerogel precursor reactant and a first solvent comprising a first polyol; wherein, the molar ratio of the first solvent molecules to the metal atoms in the reactant is at least 1:16. The method further comprises allowing the deposited sol to create a gel, wherein the gel comprises a porous solid and a pore fluid; and forming a dry, nanoporous dielectric by removing the pore fluid in a drying atmosphere without substantially collapsing the porous solid.

Preferably, the first polyol is glycerol. Preferably, the aerogel precursor reactant may selected from the group consisting of metal alkoxides, at least partially hydrolyzed metal alkoxides, particulate metal oxides, and combinations thereof. Typically, the molar ratio of the first solvent molecules to the metal atoms in the reactant is no greater than 12:1, and preferably, the molar ratio of the first solvent molecules to the metal atoms in the reactant is between 1:2 and 12:1. In some embodiments, the molar ratio of the first solvent molecules to the metal atoms in the reactant is between 2.5:1 and 12:1. In this method, it is also preferable that the nanoporous dielectric has a porosity greater than 60% and an average pore diameter less than 25 nm. It is further preferred that the pressure of the drying atmosphere during the forming step is less than the critical pressure of the pore fluid. In some embodiments, the aerogel precursor also comprises a second solvent. Preferably, the second solvent has a boiling point lower than glycerol's. In some embodiments, the first solvent also comprises a glycol, preferably selected from the group consisting of ethylene glycol, 1,4-butylene glycol, 1,5-pentanediol, and combinations thereof. After aging but before drying, in some embodiments, (especially in some glycerol-based mixtures) the aging solvent is replaced by a drying fluid. This allows, e.g. rapid, lower temperature (e.g. room temperature) drying with a fluid that evaporates faster and has a suitably low surface tension. Examples of drying fluids include, ethanol, acetone, 2-ethylbutyl alcohol and some alcohol-water mixtures.

BRIEF DESCRIPTION OF THE DRAWINGS

The present invention, including various features and advantages thereof, may be best understood with reference to the following drawings, wherein.

DETAILED DESCRIPTION OF THE PREFERRED EMBODIMENTS

Typical sol-gel thin film processes produce gels which collapse and densify upon drying, thus forming xerogels having limited porosity (Up to 60% with large pore sizes, but generally substantially less than 50% with pore sizes of interest). Under the uncontrolled drying conditions of xerogel film formation, many of the internal pores permanently collapse. However, in thin film aerogel formation, the pores remain substantially uncollapsed, even though there is often some shrinkage during aging and/or drying that affects the final density.

Figure 8A:
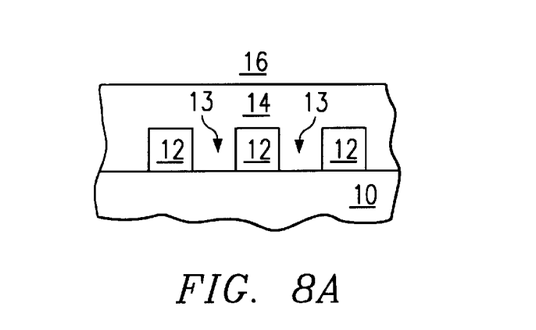
FIGS. 8A–8B contain cross-sections of a semiconductor substrate at several points during deposition of a thin film according to the present invention.

Referring now to FIG. 8A, a semiconductor substrate 10 (typically in wafer form) is shown. Common substrates include silicon, germanium, and gallium arsenide, and the substrate may include active devices, lower level wiring and insulation layers, and many other common structures not shown but known to those skilled in the art. Several patterned conductors 12 (e.g., of an Al-0.5% Cu composition) are shown on substrate 10. Conductors 12 typically run parallel for at least part of their length, such that they are separated by gaps 13 of a predetermined width (typically a fraction of a micron). Both the conductors and gaps may have height-to-width ratios much greater than shown, with larger ratios typically found in devices with smaller feature sizes.

Figure 8B:
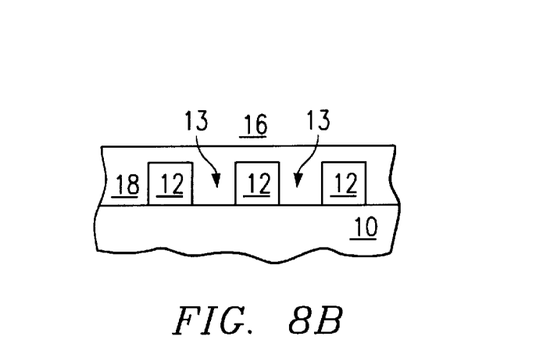

In accordance with a first embodiment of the present invention, mix 61.0 mL tetraethylorthosilicate (TEOS), 61.0 mL glycerol, 4.87 mL water, and 0.2 mL 1M $HNO_3$ and reflux for 1.5 hours at ~60° C. After the mixture is allowed to cool, the solution may be diluted down with ethanol to a composition of 80% (by volume) original stock solution and 20% (by volume) ethanol, thus reducing the viscosity. This is mixed vigorously and typically stored in a refrigerator at ~7° C. to maintain stability until use. The solution is warmed to room temperature prior to film deposition. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that has no special control of solvent saturation (e.g., in a cleanroom with standard humidity controls). During and after this deposition and spinning, the ethanol/water azeotropic mixture is evaporating from film 14, but due to glycerol's low volatility, no substantial evaporation of the glycerol is occurring. This evaporation shrinks thin film 14 and concentrates the silica content of the sol forming reduced thickness film 18. FIG. 8B shows a reduced thickness sol film 18 obtained after substantially all (about 95% or more) of the ethanol has been removed. This concentrating typically causes gelation within minutes or seconds.

Film 18 has an approximately known ratio of silicon to pore fluid at the gel point. This ratio is approximately equal to the ratio of TEOS to glycerol in the as-deposited sol (with minor changes due to remaining water, continued reactions and incidental evaporation). To the extent that the gel is prevented from collapsing, this ratio will determine the density of the aerogel film that will be produced from the sol thin film.

After gelation, the thin film wet gel 18 comprises a porous solid and a pore fluid, and can preferably be allowed time to age at one or more controlled temperatures, e.g., about a day at room temperature. It should be noted that the pore fluid changes somewhat during processing. These changes may be due to continued reactions, evaporation/condensation, or chemical additions to the thin film. After gelation, the pore fluid may preferably be left in place, however, it may be diluted or replaced by a different fluid (e.g. replace glycerol and water mixture with glycerol). Whether this fluid is identical to the as-gelled fluid or not, the pore fluid that is present during aging is sometimes referred to as "aging fluid". Aging may preferably be accomplished by letting the substrate and gel sit for approximately 24 hours at about 25 degrees C. or by heating it to 130–150° C. for about 1 minute in a closed container.

Aged film 18 may be dried without substantial densification by one of several methods, including supercritical fluid extraction. However, with these new glycerol-based gels, one alternative is to use a solvent exchange to replace the aging fluid with a drying fluid and then air dry the film 18 from this drying fluid. This preferred drying method uses a solvent exchange to dilute the aging fluid or replace it with a different fluid (e.g. use a large volume of acetone to dilute the glycerol and water mixture, thus forming a mixture dominated by acetone). Whether this fluid is identical to the aging fluid or not, the pore fluid that is present during drying is sometimes referred to as "drying fluid". If used, the solvent exchange replaces the aging fluid that is dominated by the glycerol and its associated high surface tension with a drying fluid that has a lower surface tension. This solvent exchange may preferably be carried out by dispensing approximately 5–8 mL of acetone at room temperature onto aged thin film 18, then spinning the wafer between approximately 250 and 500 rpm for about 5–10 seconds. In this solvent exchange method, it is preferred to remove nearly all the glycerol before drying. The drying fluid (acetone in this case) is finally allowed to evaporate from the wet gel 18, forming a dry porous dielectric (dried gel).

This evaporation be performed by exposing the wafer surface to an atmosphere that is not near saturated with the drying fluid. For example, the wafer could be in a substantially uncontrolled atmosphere, or a drying gas could be introduced into the atmosphere. To prevent boiling, drying should start at a temperature somewhat below the boiling point of the drying fluid, such as room temperature. If a higher boiling point drying fluid, such as ethylene glycol, is used, the starting drying temperature can be increased to a temperature near or equal to the aging temperature. As the thin film becomes predominately dry (typically within seconds), the temperature should then be increased above the boiling point of both the aging fluid and the drying fluid. This method prevents destructive boiling, yet insures that all fluid is removed.

In order to reduce the dielectric constant, it is preferable to dehydroxylate (anneal) the dried gel. This may be done by placing the wafer in a forming gas atmosphere comprised of 10 volume % H2, 90 volume % N2 at atmospheric pressure, and baking at 450 C. for approximately 30 minutes.

Figure 9:
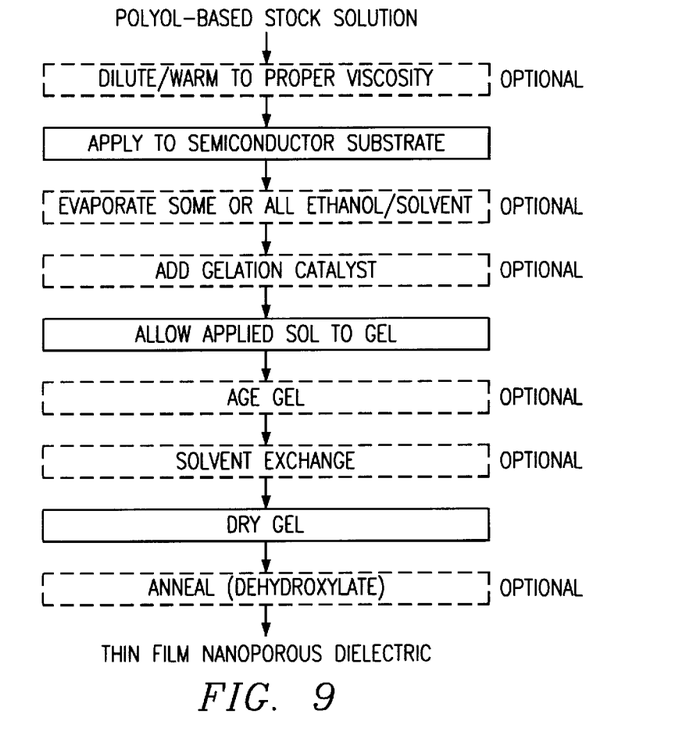
FIG. 9 is a flow chart of a deposition process for a nanoporous dielectric according to the present invention.

FIG. 9 contains a flow chart of a general method for obtaining an aerogel thin film from a precursor sol according to one embodiment of the present invention. Table 5 is a quick summary of some of the substances used in this method.

TABLE 5

Substance Summary

| Ref # | Specific Example | Functional Description | Preferred Alternates |
|---|---|---|---|
| 10 | Silicon | Semiconductor Substrate | Ge, GaAs, active devices, lower level layers |
| 12 | Al—0.5%Cu | Patterned Conductors | Al, Cu, other metals, polysilicon |
|  | TEOS | Precursor Sol Reactant | Other silicon-based metal alkoxides (TMOS, MTEOS, BTMSE, etc.), alkoxides of other metals, particulate metal oxides, organic precursors, and combinations thereof |
|  | Glycerol | Precursor Sol First Solvent (Low volatility) | Other polyols, combinations of glycerol, Ethylene glycol, 1,4-butylene glycol, 1,5-pentanediol, and/or other polyols. |
|  | Nitric Acid ($HNO_3$) | Precursor Sol Stabilizer | Other acids |
|  | Ethanol | Precursor Sol Second Solvent (High volatility) | Methanol, other alcohols |
|  | Ethanol | Viscosity Reduction Solvent | Methanol, other alcohols |
|  | TMCS | Surface Modification Agent | Hexamethyldisilazane (HMDS), trimethylmethoxysilane, dimethyl-dimethoxysilane, phenyl compounds and fluorocarbon compounds. |
|  | Ammonium Hydroxide ($NH_4OH$) | Gelation Catalyst | Ammonia, volatile amine species, volatile fluorine species, and other compounds that will raise the pH of the deposited sol. Nitric acid and other compounds that will lower the pH. |
|  | As-Gelled Pore Fluid | Aging Fluid | Glycerol, ethylene glycol, other polyols, water, ethanol, other alcohols, combinations thereof. |
|  | Acetone | Drying Fluid | Aging fluid, heated aging fluid, heptane, isoproponal, ethanol, methanol, 2-ethylbutyl alcohol, alcohol/water mixtures, ethylene glycol, other liquids that are miscible with the aging fluid, yet have lower surface tension than the aging fluid, combinations thereof. |

In accordance with a second, more TEOS-rich, embodiment of the present invention, 140 mL tetraethylorthosilicate (TEOS), 61.0 mL glycerol, 12.0 mL water, 140 mL ethanol, and 0.352 mL 1 M $HNO_3$ are mixed and reflux for 1.5 hours at ~60° C. After the mixture is allowed to cool, the solution may be diluted down with ethanol to a composition of 80% (by volume) original stock solution and 20% (by volume) ethanol, thus reducing the viscosity. This is typically stored in a refrigerator at ~7° C. to maintain stability until use. The solution is warmed to room temperature prior to film deposition. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in an atmosphere that is not solvent controlled (e.g. standard exhausts in a cleanroom with standard humidity controls). During and after this deposition and spinning, ethanol (a reaction product from the TEOS and water) and water is evaporating from film 14, but due to glycerol's low volatility, no substantial evaporation of the glycerol is occurring. This evaporation shrinks thin film 14 and concentrates the silica content of the sol forming reduced thickness film 18. FIG. 8B shows a reduced thickness sol film 18 obtained after substantially all (about 95% or more) of the water has been removed. This concentrating typically causes gelation within minutes.

Further processing generally follow the process described in the first preferred embodiment. After gelation, the thin film wet gel 18 comprises a porous solid and a pore fluid, and can preferably be allowed time to age at one or more controlled temperatures. Aging may preferably be accomplished by letting the device sit for approximately 24 hours at 25 degrees C. Aged film 18 may be dried without substantial densification by one of several methods, including supercritical fluid extraction. However, with these new glycerol-based gels, it is preferable to perform a solvent exchange followed by air drying the film 18 from the drying fluid, as described in the first preferred embodiment. In order to reduce the dielectric constant, it is preferable to dehydroxylate (anneal) the dried gel, as described in the first preferred embodiment.

Figure 4:
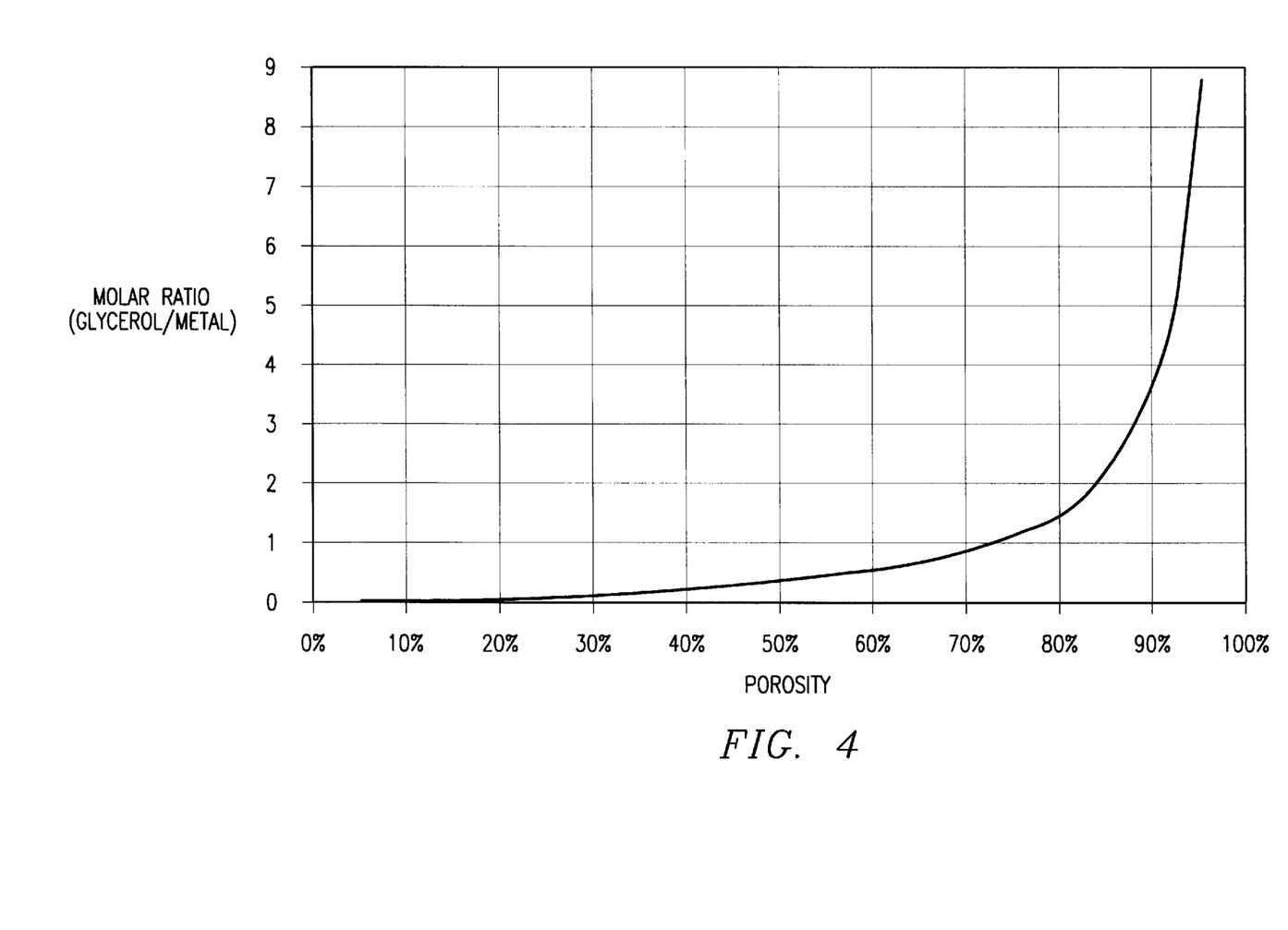
FIG. 4 contains a graph of the theoretical molar ratio of glycerol molecules to metal atoms vs. porosity of a nonoporous dielectric according to the present invention.

Other ratios of solvent to reactant ratios can be used to provide different porosities. FIG. 4 shows the theoretical relationship between the molar ratio of glycerol molecules to metal atoms and the porosity of a nanoporous dielectric for the case where all ethanol is evaporated from the deposited sol. However, the lower porosity gels require care to prevent early gelation. This may comprise pH adjustment, temperature control, or other methods known in the art. In some applications, it is also permissible to allow ethanol evaporation after gelation.

In accordance with a ethylene glycol containing third embodiment of the present invention, mix tetraethylorthosilicate (TEOS), ethylene glycol, ethanol, water, and acid (1M $HNO_3$) in a molar ratio of 1:2.4:1.5:1:0.042 and reflux for 1.5 hours at ~60° C. After the mixture is allowed to cool, the solution is diluted down with ethanol to a composition of 70% (by volume) original stock solution and 30% (by volume) ethanol. This is mixed vigorously and typically stored in a refrigerator at ~7° C. to maintain stability until use. The solution is warmed to room temperature prior to film deposition. A mixture of stock solution and 0.25M $NH_4OH$ catalyst (10:1 volume ratio) is combined and mixed. 3–5 mL of this precursor sol may be dispensed at room temperature onto substrate 10, which is then spun at 1500 to 5000 rpm (depending on desired film thickness) for about 5–10 seconds to form sol thin film 14. The deposition can be performed in a cleanroom with standard humidity controls. During and after this deposition and spinning, the ethanol/water azeotropic mixture is evaporating from film 14, but due to ethylene glycol's low volatility, no substantial evaporation of the ethylene glycol is occurring. This evaporation shrinks thin film 14 and concentrates the silica content of the sol forming reduced thickness film 18. FIG. 8B shows a reduced thickness sol film 18 obtained after substantially all (about 95% or more) of the ethanol has been removed. This concentrating, combined with the catalyst, typically causes gelation within minutes or seconds.

Film 18 has an approximately known ratio of silicon to pore fluid at the gel point. This ratio is approximately equal to the ratio of TEOS to ethylene glycol in the as-deposited sol (with minor changes due to remaining water, continued reactions and incidental evaporation). To the extent that the gel is prevented from collapsing, this ratio will determine the density of the aerogel film that will be produced from the sol thin film.

After gelation, the thin film wet gel 18 comprises a porous solid and a pore fluid, and can preferably be allowed time to age at one or more controlled temperatures, e.g., about a day at room temperature. It should be noted that the pore fluid changes somewhat during processing. These changes may be due to continued reactions, evaporation/condensation, or chemical additions to the thin film. After gelation, the pore fluid may preferably be left in place, however, it may be diluted or replaced by a different fluid (e.g. replace ethylene glycol and water mixture with ethylene glycol). Whether this fluid is identical to the as-gelled fluid or not, the pore fluid that is present during aging is sometimes referred to as "aging fluid". Aging may preferably be accomplished by letting the device sit in a near saturated aging fluid atmosphere for approximately 5 minutes at about 100 degrees C. It is preferred that the thin film wet gel 18 does not dry prematurely. However, it is also preferred to prevent condensation on the surface of the wet gel. This balance between preventing both drying and condensation is a motivation behind the preference for maintaining the near saturated aging fluid atmosphere. An acceptable aging approach at 100 degrees C. may be to control the ethylene glycol content of an aging atmosphere to 99±1% of saturation.

Aged film 18 may be dried without substantial densification by one of several methods, including supercritical fluid extraction. However, with these new ethylene glycol-based gels, it is preferable to air dry the film 18 from the aging fluid. This air drying may be performed by exposing the wafer surface to an atmosphere that is not near saturated with the drying fluid. For example, the wafer could be moved from the aging atmosphere to a substantially uncontrolled atmosphere, or another gas could be introduced into the aging atmosphere. To prevent boiling, drying should start at a temperature somewhat below the boiling point of the drying fluid, such as room temperature or the aging temperature. As the thin film becomes predominately dry (typically within seconds), the temperature may then be increased above the boiling point of both the aging fluid and the drying fluid. This method prevents destructive boiling, yet insures that all fluid is removed.

It should be noted that the aging fluid (somewhat like the pore fluid) changes somewhat during processing. These changes may be due to continued reactions, evaporation/condensation, or chemical additions to the thin film. Preferably, the aging fluid may be left in place after aging. However, one may use a solvent exchange to dilute the aging fluid or replace it with a different fluid (e.g. use a large volume of acetone to dilute the ethylene glycol and water mixture, thus forming a mixture dominated by acetone). Whether this fluid is identical to the aging fluid or not, the pore fluid that is present during drying is sometimes referred to as "drying fluid". If used, The solvent exchange replaces the aging fluid that is dominated by the ethylene glycol and its associated high surface tension with a drying fluid that has a lower surface tension. This solvent exchange may preferably be carried out by dispensing approximately 5–8 mL of acetone at room temperature onto aged thin film 18, while spinning the wafer between approximately 250 and 500 rpm for about 5–10 seconds. In this solvent exchange method, it is preferred to remove nearly all the ethylene glycol before drying. The drying fluid (acetone in this case) is finally allowed to evaporate from the wet gel 18, forming a dry porous dielectric (dried gel).

In order to reduce the dielectric constant, it is preferable to dehydroxylate (anneal) the dried gel. This may be done by placing the wafer in a forming gas atmosphere comprised of 10 volume % $H_2$, 90 volume % $N_2$ at atmospheric pressure, and baking at 450 C. for approximately 30 minutes.

In accordance with a fourth, more ethylene glycol rich, embodiment of the present invention, mix tetraethylorthosilicate (TEOS), ethylene glycol, water, and acid (1M $HNO_3$) in a molar ratio of 1:4:1:0.042 and reflux for 1.5 hours at ~60° C. After the mixture is allowed to cool, the solution may be diluted down with ethanol to a composition of 70% (by volume) original stock solution and 30% (by volume) ethanol, thus reducing the viscosity. This is typically stored in a refrigerator at ~7° C. to maintain stability until use. The solution is warmed to room temperature prior to film deposition. 3–5 mL of this precursor sol may be dispensed (without catalyst) at room temperature onto substrate 10, which is then spun at 1500 to 5000 rpm (depending on desired film thickness) for about 5–10 seconds to form sol thin film 14. The deposition can be performed in a cleanroom with standard exhausts and humidity controls. During and after this deposition and spinning, ethanol (a reaction product from the TEOS and water) and water is evaporating from film 14, but due to ethylene glycol's low volatility, no substantial evaporation of the ethylene glycol is occurring. This evaporation shrinks thin film 14 and concentrates the silica content of the sol forming reduced thickness film 18. FIG. 8B shows a reduced thickness sol film 18 obtained after substantially all (about 95% or more) of the water has been removed. This concentrating typically causes gelation within minutes.

Further processing generally follow the process described in the third preferred embodiment. After gelation, the thin film wet gel 18 comprises a porous solid and a pore fluid, and can preferably be allowed time to age at one or more controlled temperatures. Aging may preferably be accomplished by letting the device sit in a near saturated aging fluid atmosphere for approximately 5 minutes at about 100 degrees C. Aged film 18 may be dried without substantial densification by one of several methods, including supercritical fluid extraction. However, with these new ethylene glycol-based gels, it is preferable to air dry the film 18 from the aging fluid, as described in the third preferred embodiment. In order to reduce the dielectric constant, it is preferable to dehydroxylate (anneal) the dried gel, as described in the third preferred embodiment.

An alternate method utilizes aging and drying glycerol films without solvent-exchange. An unaged wafer is placed in a small volume furnace, and the furnace preferably evacuated at room temperature. The furnace remains sealed as the temperature is ramped up, aging the film. After the drying temperature at which the glycerol viscosity is low enough (compared to the strength of an aged film of the predetermined porosity), the glycerol in the furnace atmosphere is removed. Note that the drying temperature, in many applications, is greater than the boiling point of glycerol, in which cases; the furnace needs to withstand the pressure and care needs to be taken that the glycerol in the furnace atmosphere is, especially at first, slowly removed. The glycerol in the furnace atmosphere may, e.g., be removed by bleeding off the pressure, by a vacuum pump, or by sweeping the glycerol off with the annealing gas (e.g. forming gas). The furnace temperature may be held constant or continue to be raised while the glycerol is being removed (the furnace may be ramped on up to annealing temperature while sweeping the glycerol off with the annealing gas). While some glycerol can be introduced during heating to minimize evaporation from the film, preferably the furnace volume is low enough that evaporation does not significantly reduce film thickness even without the introduction of glycerol during heating.

Figure 10:
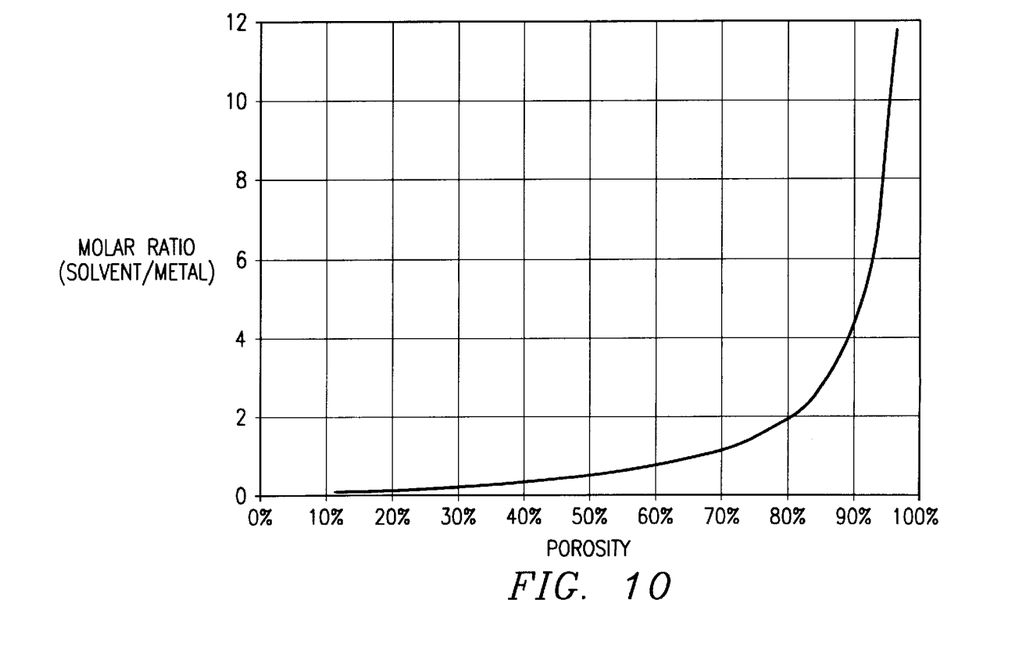
FIG. 10 contains a graph of the theoretical molar ratio of first solvent molecules to metal atoms vs. porosity of a nanoporous dielectric according to the present invention.

Other ratios of solvent to reactant ratios can be used to provide different porosities. FIG. 10 shows the theoretical relationship between the molar ratio of ethylene glycol molecules to metal atoms and the porosity of a nanoporous dielectric for the case where all ethanol is evaporated from the deposited sol. However, the lower porosity gels may require care to prevent early gelation. This may comprise pH adjustment, temperature control, or other methods known in the art. In some applications, it is also permissible to allow ethanol evaporation after gelation.

Although this invention has been described in terms of several embodiments, many of these steps may be modified within the scope of the invention, and other steps can be included to enhance the overall process. For example, the initial thin film may be deposited by other common methods, such as dip-coating or spray-coating instead of spin-coating. Likewise, the solvent exchange may use dip coating, spray coating, or immersion in a liquid or vaporous solvent instead of spin-coating. When using a vaporous solvent, the wafer may be cooled to a temperature lower than the atmosphere, thus promoting condensation on the wafer. While water might be considered a solvent in such a process, for discussion purposes in this application, water is not considered a solvent.

One modification is to change the mix ratios of polyol and alcohol of the first preferred embodiment. This variation can change the gel's properties. One such change is the gel time. Table 6 below shows the results of varying the ethanol to ethylene glycol ratios in the precursor sol of some sample bulk gels with catalysts. These gels used generally the same sol mixture as the third preferred embodiment except for the ethanol to ethylene glycol ratio. Also, in the non-polyol-based mix, the catalyst concentration is different. This non-polyol-based gel used 0.5 M $NH_4OH$ catalyst in a volume ratio of 1:10, instead of the 0.25 M $NH_4OH$ used in the others.

TABLE 6

Effect of Varying the Ethylene Glycol Content of the Precursor Sol

| Bulk Example # | Ethanol Content (mL) | Ethylene Glycol Content (mL) | Gel Time (minutes) |
|---|---|---|---|
| 1 (Non-Polyol-Based) | 61 | 0 | 7 to 10 |
| 2 | 36.6 | 24.4 | 5 to 7 |
| 3 | 30.5 | 30.5 | 2 to 3 |
| 4 | 24.4 | 36.6 | 1 to 2 |
| 5 | 0 | 61 | 1 to 2 |

Another example of modification to the basic method is that, before drying (and typically, but not necessarily, after aging), the thin film wet gel 18 may have its pore surfaces modified with a surface modification agent. This surface modification step replaces a substantial number of the molecules on the pore walls with those of another species. If a surface modifier is applied, it is preferable to remove the water from the wet gel 18 before the surface modifier is added. The water can be removed by immersing the wafer in pure ethanol, preferably by a low speed spin coating as described in the solvent exchange in the first embodiment example. This water removal could be beneficial, because water will react with many surface modification agents, such as TMCS; however, it is not necessary. With our new polyol-based method, surface modification need not be performed to help lessen pore collapse, it can be used to impart other desirable properties to the dried gel. Some examples of potentially desirable properties are hydrophobicity, reduced dielectric constant, increased resistance to certain chemicals, and improved temperature stability. Some potential surface modifiers that may impart desirable properties include hexamethyldisilazane (HMDS), the alkyl chlorosilanes (trimethylchlorosilane (TMCS), dimethyldichlorosilane, etc.), the alkylalkoxysilanes (trimethylmethoxysilane, dimethyldimethoxysilane, etc.), phenyl compounds and fluorocarbon compounds. The useful phenyl compounds will typically follow the basic formula, $Ph_xA_ySiB_{(4-x-y)}$, where, Ph is a phenolic group, A is a reactive group such as Cl or $OCH_3$, and B are the remaining ligands which, if there are two, can be the same group or different. Some examples of these phenyl surface modification agents include compounds with 1 phenolic group such as phenyltrichlorosilane, phenyltrifluorosilane, phenyltrimethoxysilane, phenyltriethoxysilane, phenylmethylchlorosilane, phenylethyldichlorosilane, phenyldimethylethoxysilane, phenyldimethylchlorosilane, phenyldichlorosilane, phenyl(3-chloropropyl)dichlorosilane, phenylmethylvinylchlorosilane, phenethyldimethylchlorosilane, phenyltrichlorosilane, phenyltrimethoxysilane, phenyltris(trimethylsiloxy)silane, and phenylallyldichlorosilane. Other examples of these phenyl surface modification agents include compounds with 2 phenolic groups such as diphenyldichlorosilane, diphenylchlorosilane, diphenylfluorosilane, diphenylmethylchlorosilane, diphenylethylchlorosilane, diphenyldimethoxysilane, diphenylmethoxysilane, diphenylethoxysilane, diphenylmethylmethoxysilane, diphenylmethylethoxysilane and diphenyldiethoxysilane. These phenyl surface modification agents also include compounds with 3 phenolic groups such as triphenylchlorosilane, triphenylflourosilane, and triphenylethoxysilane. Another important phenyl compound, 1,3-diphenyltetramethyldisilazane, is an exception to this basic formula. These lists are not exhaustive, but do convey the basic nature of the group. The useful fluorocarbon based surface modification agents include (3,3,3-trifluoropropyl)trimethoxysilane), (tridecafluoro-1, 1 ,2,2-tetrahydrooctyl)-1dimethylchlorsilane, and other fluorocarbon groups that have a reactive group, such as Cl or $OCH_3$, that will form covalent bonds with a hydroxyl group.

The paragraph above lists some of the typical useful properties for many conventional applications. However, there are other potential applications for nanoporous dielectrics and aerogels that may have different desirable properties. Examples of some other potentially desirable properties include hydrophilicity, increased electrical conductivity, increased dielectric breakdown voltage, increased reactivity with certain chemicals, and increased volatility. This list is not exhaustive. However, it shows that, depending upon the application, many different types of properties may be desirable. Thus, it is clear that many other materials that will form covalent bonds with hydroxyl groups are potential surface modifiers that may impart other potentially desirable properties.

This invention also comprises using gelation catalysts with the glycerol-based and other polyol-based sols, not just the ethylene glycol-based sols. This also includes the allowance of other gelation catalysts in place of the ammonium hydroxide and/or for the gelation catalyst to be added after deposition. Typically, these alternate catalysts modify the pH of the sol. It is preferable to use catalysts that raise the pH, although acid catalysts can be used. Typically, acid catalysis results in longer processing times and a denser dielectric than a base catalyzed process. Some examples of other preferred gelation catalysts include ammonia, the volatile amine species (low molecular weight amines) and volatile fluorine species. When the catalyst is added after deposition, it is preferable to add the catalyst as a vapor, mist, or other vaporish form.

Thus, this invention allows production of nanoporous dielectrics at room temperature and atmospheric pressure, without a separate surface modification step. Although not required to prevent substantial densification, this new method does not exclude the use of supercritical drying or surface modification steps prior to drying. To the extent that the freezing rates are fast enough to prevent large (e.g. 50 nm) crystals, it is also compatible with freeze drying. In general, this new method is compatible with most prior art aerogel techniques. Although this new method allows fabrication of aerogels without substantial pore collapse during drying, there may be some permanent shrinkage during aging and/or drying. This shrinkage mechanism is not well understood; however, it behaves in a manner similar to syneresis.

Other examples of modifications involve the reaction atmosphere and/or temperature. Also coating and gelation need not be performed in the same chamber or even in the same atmosphere. For instance, coating may be done with a controlled ambient that prevents evaporation of low volatility components (particularly at higher temperatures where even the low volatility components evaporate more rapidly), or in an ambient that also prevents evaporation of high volatility components. Additionally, the substrate may have its temperature elevated to speed surface modification and/or gelation. Also, total pressure and/or temperature may be varied to further control evaporation rates and/or gel time. Elevated temperature processing is typically performed at no less than 40° C.; however, 50° C. is preferred, and 70° C. is more preferred. When working at elevated temperatures, care should be taken (e.g., the partial pressures in the reaction atmosphere should be high enough) to prevent solvent boiling.

Although TEOS has been used as a representative example of a reactant, other metal alkoxides may be used either alone or in combination with TEOS or each other to form a silica network. These metal alkoxides include tetramethylorthosilicate (TMOS), methyltriethoxysilane (MTEOS), 1,2-Bis(trimethoxysilyl)ethane (BTMSE), combinations thereof, and other silicon-based metal alkoxides known in the art. A sol may also be formed from alkoxides of other metals known in the art such as aluminum and titanium. Some other precursor sols known in the art include particulate metal oxides and organic precursors. Two representative particulate metal oxides are pyrogenic (fumed) silica and colloidal silica. Some representative organic precursors are melamine, phenol furfural, and resorcinol. In addition to alternate reactants, alternate solvents may also be used. Some examples of preferred alternates for ethanol are methanol and the other higher alcohols. Other acids may be used as a precursor sol stabilizer in place of the nitric acid.

An additional modification is to allow and/or promote the formation of moderate sized (15 to 150 monomers per molecule) oligomers in the precursor sol. These larger oligomers may speed the gelation process in the deposited sol. A sol containing large oligomers may have a higher viscosity than a sol with small oligomers. However, as long as the viscosity is stable, this higher viscosity can be compensated by methods known in the art, such as adjusting solvent ratios and spin conditions. To help achieve this desired stable viscosity, the oligomerization may need to be slowed or substantially halted before deposition. Potential methods of promoting oligomerization might include heating the precursor sol, evaporating solvent, or adding small amounts of a gelation catalyst such as ammonium hydroxide. Potential methods of retarding oligomerization might include cooling the precursor sol, diluting the sol with a solvent, or restoring the precursor sol to a pH that minimizes condensation and gelation (Nitric acid could be used in conjunction with the ammonium hydroxide exemplified above).

Although the present invention has been described with several sample embodiments, various changes and modifications may be suggested to one skilled in the art. It is intended that the present invention encompass such changes and modifications as fall within the scope of the appended claims.

What is claimed is:

1. A method for forming a thin film aerogel on a semiconductor substrate, the method comprising the steps of:
   a) providing a semiconductor substrate comprising a microelectronic circuit;
   b) depositing an aerogel precursor sol upon said substrate; wherein said aerogel precursor sol comprises a metal-based aerogel precursor reactant, wherein said reactant is a compound containing metal atoms, an alcohol, and a first solvent comprising a first polyol; wherein,
      the molar ratio of said first solvent molecules to the metal atoms in said reactant is at least 1 first solvent molecule per 16 metal atoms;
   c) allowing said deposited sol to create a gel, wherein said gel comprises a porous solid and a pore fluid; and
   d) forming a dry aerogel by removing said pore fluid in a drying atmosphere,
      wherein the pressure of said drying atmosphere during said forming step is less than the critical pressure of said pore fluid, and
      the temperature of said substrate during said forming step is above the freezing temperature of said pore fluid.

2. A method for forming a thin film nanoporous dielectric on a semiconductor substrate, the method comprising the steps of:
   a) providing a semiconductor substrate;
   b) depositing an aerogel precursor sol upon said substrate; wherein said aerogel precursor sol comprises
      a metal-based aerogel precursor reactant, wherein said reactant is a compound containing metal atoms, an alcohol, and
      a first solvent comprising a polyol; wherein,
      the molar ratio of said first solvent molecules to the metal atoms in said reactant is at least 1 first solvent molecule per 16 metal atoms;
   c) allowing said deposited sol to create a gel, wherein said gel comprises a porous solid and a pore fluid; and
   d) forming a dry, nanoporous dielectric by removing said pore fluid in a drying atmosphere,
      wherein the pressure of said drying atmosphere during said forming step is less than the critical pressure of said pore fluid, and
      the temperature of said substrate during said forming step is above the freezing temperature of said pore fluid.

3. A method for forming a thin film nanoporous dielectric on a semiconductor substrate, the method comprising the steps of:
   a) providing a semiconductor substrate;
   b) depositing an aerogel precursor sol upon said substrate; wherein said aerogel precursor sol comprises
      an aerogel precursor reactant selected from the group consisting of metal alkoxides, at least partially hydrolyzed metal alkoxides, and combinations thereof, wherein said metal alkoxide contains metal atoms, and
      a first solvent comprising a polyol; wherein,
      the molar ratio of said first solvent molecules to the metal atoms in said reactant is at least 1 first solvent molecule per 16 metal atoms;
   c) allowing said deposited sol to create a gel, wherein said gel comprises a porous solid and a pore fluid; and
   d) forming a dry, nanoporous dielectric by removing said pore fluid in a drying atmosphere without substantially collapsing said porous solid,
      wherein the pressure of said drying atmosphere during said forming step is less than the critical pressure of said pore fluid, and
      the temperature of said substrate during said forming step is above the freezing temperature of said pore fluid.

4. The method of claim 3, wherein:
the molar ratio of said first solvent molecules to the metal atoms in said reactant is no greater than 12:1.

5. The method of claim 3, wherein:
the molar ratio of said first solvent molecules to the metal atoms in said reactant is between 1:2 and 12:1.

6. The method of claim 3, wherein:
the molar ratio of said first solvent molecules to the metal atoms in said reactant is between 2.5:1 and 12:1.

7. The method of claim 3, wherein:
said nanoporous dielectric has a porosity greater than 60% and an average pore diameter less than 100 nm.

8. The method of claim 3, wherein:
said method does not comprise the step of adding a surface modification agent before said forming step.

9. The method of claim 3, wherein:
said nanoporous dielectric has a porosity greater than 60% and an average pore diameter less than 100 nm;
wherein, said method does not comprise the step of adding a surface modification agent before said forming step.

10. The method of claim 3, further comprising the step of:
aging said gel before said forming step.

11. The method of claim 10, wherein:
at least part of said aging step is performed in a substantially closed container.

12. The method of claim 10, wherein:
the temperature of said gel during said aging is greater than 30 degrees C.

13. The method of claim 10, wherein:
the temperature of said gel during said aging is greater than 80 degrees C.

14. The method of claim 10, wherein:
the temperature of said gel during said aging is greater than 130 degrees C.

15. The method of claim 1, wherein the alcohol is ethanol.
16. The method of claim 2, wherein the alcohol is ethanol.
17. The method of claim 3, wherein the aerogel precursor sol also comprises ethanol.

* * * * *